United States Patent
Fu et al.

(10) Patent No.: US 6,831,494 B1
(45) Date of Patent: Dec. 14, 2004

(54) VOLTAGE COMPENSATED INTEGRATED CIRCUITS

(75) Inventors: Robert Fu, Cupertino, CA (US); Neal A. Osborn, Milpitas, CA (US); James B. Burr, Foster City, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

(21) Appl. No.: 10/439,665

(22) Filed: May 16, 2003

(51) Int. Cl.[7] .......................... H03K 3/037; H03K 3/12
(52) U.S. Cl. .................. 327/199; 327/208; 327/218
(58) Field of Search .................. 327/199–203, 327/208–212, 218; 331/57

(56) References Cited

U.S. PATENT DOCUMENTS

| | | | | |
|---|---|---|---|---|
| 5,264,738 A | * | 11/1993 | Veendrick et al. | 327/203 |
| 5,467,038 A | * | 11/1995 | Motley et al. | 327/185 |
| 5,677,650 A | * | 10/1997 | Kwasniewski et al. | 331/57 |
| 5,982,211 A | * | 11/1999 | Ko | 327/202 |
| 6,031,403 A | * | 2/2000 | Gersbach | 327/206 |
| 6,087,886 A | * | 7/2000 | Ko | 327/408 |
| 6,154,100 A | * | 11/2000 | Okamoto | 331/57 |
| 6,188,260 B1 | * | 2/2001 | Stotz et al. | 327/202 |
| 6,538,471 B1 | * | 3/2003 | Stan et al. | 326/46 |
| 6,621,318 B1 | * | 9/2003 | Burr | 327/218 |

* cited by examiner

Primary Examiner—Tuan T. Lam
(74) Attorney, Agent, or Firm—Wagner, Murabito & Hao LLP

(57) ABSTRACT

A method and system of voltage compensated integrated circuits. Operating characteristics of integrated circuitry are enhanced by application of voltage compensation.

5 Claims, 4 Drawing Sheets

VOLTAGE COMPENSATED INTEGRATED CIRCUITS

FIELD OF THE INVENTION

Embodiments in accordance with the present invention relate to the design and operation of integrated circuits. Specifically, an inverter circuit and a ring oscillator circuit are disclosed in embodiments in accordance with the present invention.

BACKGROUND

Semiconductor devices, e.g., digital logic integrated circuits, are generally operated with a positive supply voltage. However, the characteristics of such circuitry, e.g., operating frequency, gate delay and the like, vary widely with changes in supply voltage.

SUMMARY OF THE INVENTION

A method and system of voltage compensated integrated circuits are disclosed. Specifically, a voltage compensated inverter circuit is disclosed in accordance with one embodiment of the present invention. Also, a voltage compensated ring oscillator circuit is disclosed in accordance with another embodiment of the present invention.

DETAILED DESCRIPTION OF THE INVENTION

Figure 1:
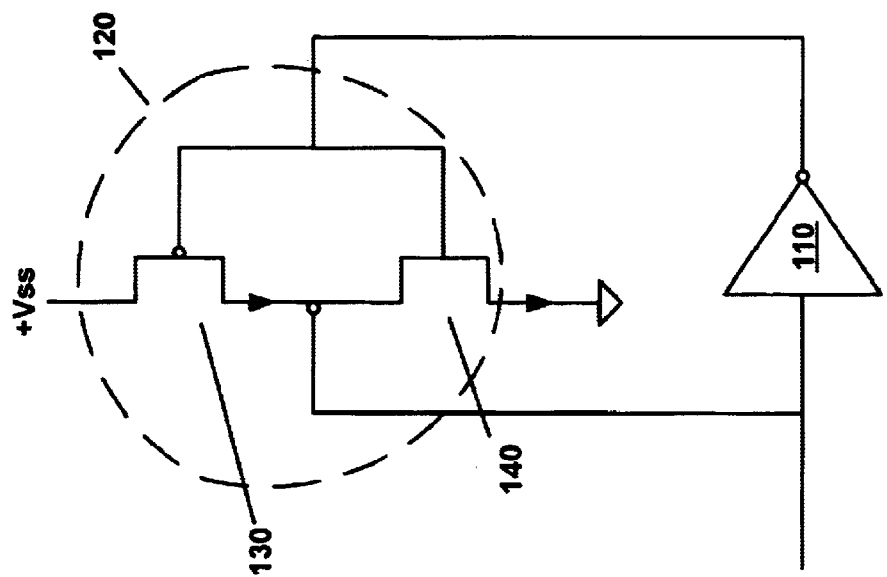
FIG. 1 illustrates a voltage compensated inverter circuit, in accordance with embodiments of the present invention.

In the following detailed description of the present invention, voltage compensated integrated circuits, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Voltage Compensated Integrated Circuits

Embodiments of the present invention are described in the context of design and operation of integrated semiconductors. More particularly, embodiments of the present invention relate to voltage compensated integrated circuits. It is appreciated, however, that elements of the present invention may be utilized in other areas of semiconductor operation.

Although the following description of embodiments in accordance with the present invention describes semiconductors formed in p-type materials, it is to be appreciated that symmetries with n-type materials are well known. For example, in general, exchanging p-type materials and processes with n-type materials and processes, and changing voltages from positive to negative can create symmetric structures and behaviors. Consequently, embodiments in accordance with the present invention are well suited to semiconductors formed in n-type materials, and such embodiments are considered within the scope of the present invention.

Variations in the operating of integrated circuits corresponding to changes in supply voltage are well known. For example, the same integrated circuit generally operates faster at a higher supply voltage than it does at a lower voltage.

It is oftentimes desirable to minimize such variations in operation of integrated circuits with respect to variations in supply voltage. For example, a design may desire for gate delay characteristics to remain relatively constant over a range of supply voltages. As another example, it may be advantageous to operate an integrated circuit during periods of unusually wide supply voltage fluctuations, for example, during a power supply ramp up or ramp down.

A typical power supply for an integrated circuit does not instantaneously switch from an "off" state, supplying no power, to an "on" state, supplying voltage and current levels within an operating tolerance range for the integrated circuit. There is usually a finite period of time during which the voltage and current levels smoothly transition from zero to rated levels. Frequently, bulk and distributed capacitance of a printed wiring board associated with the integrated circuit and power supply also influence such transitions. This period is generally known or described as a "ramp," "voltage ramp" or "ramp up" period. Similarly, when a power supply switches to an off state, voltage and current levels ramp "down."

It may be desirable to operate an integrated circuit during ramp up and ramp down periods. For example, during ramp down, a computer system, e.g., a computer powered by removable batteries, may desire to perform "housekeeping" tasks, e.g., to save information from volatile memory to non-volatile memory. By way of further example, it may be advantageous to operate certain circuits, e.g., a timing source, during a ramp up period.

In order to perform such tasks during ramp up or ramp down, it is desirable to utilize circuits with greater resistance to voltage variations than are available under the conventional art. It is further known to adjust the supply voltage of integrated circuits, e.g., a microprocessor, to optimize a relationship between performance requirements and power consumption of an integrated circuit. Such operations can be enabled, or a range of voltage adjustment can be extended, by utilizing circuits with greater resistance to voltage variations than are available under the conventional art.

FIG. 1 illustrates a voltage compensated inverter circuit 100, in accordance with embodiments of the present invention. Voltage compensated inverter circuit 100 comprises a conventional inverter circuit 110 and voltage compensating feedback circuit 120. Voltage compensating feedback circuit 120 is coupled to conventional inverter circuit 110.

Voltage compensating feedback circuit 120 comprises p-type transistor element 130 and n-type transistor element 140. It is to be appreciated that voltage compensating feedback circuit 120 forms an inverter circuit, and that the input of voltage compensating feedback circuit 120 is coupled to the output of conventional inverter circuit 110. Likewise, the output of voltage compensating feedback circuit 120 is coupled to the input of conventional inverter circuit 110.

Transistor elements 130 and 140 are constructed so as to have a higher threshold voltage than the transistor elements comprising conventional inverter circuit 110. In accordance with embodiments of the present invention, such a higher threshold voltage may be achieved by constructing transistor elements 130 and 140 as "thick gate" devices. It is appreciated that conventional inverter circuit 110 can be produced with conventional gate thicknesses as are standard to a particular logic family for a particular semiconductor process. Embodiments in accordance with the present invention are well suited to other techniques of adjusting threshold voltages of transistor devices, e.g., varying gate length and/or changing doping concentrations.

For example, for an exemplary 0.13 micron process, a standard gate can have a thickness of about 17 Angstroms, corresponding to a typical threshold voltage of about 250 mV, and begins to operate at about 350 mV. A "thick" gate can have a thickness of about 70 Angstroms, a typical threshold voltage of about 500 mV, and begin to operate at about 600 mV.

In general, semiconductor devices operate faster at higher supply voltages than at lower supply voltages. For example, conventional inverter circuit 110 will generally have a higher maximum frequency, faster switching time and lower gate delay at a higher supply voltage than at a lower supply voltage. Similarly, voltage compensating feedback circuit (inverter) 120 will generally have a higher maximum frequency, faster switching time and lower gate delay at a higher supply voltage than at a lower supply voltage.

When voltage compensating feedback circuit 120 is operating, it will oppose the operation of conventional inverter circuit 110. More specifically, voltage compensating feedback circuit 120 tends to lower the maximum frequency and switching time, and increase the gate delay of conventional inverter circuit 110.

Because voltage compensating feedback circuit 120 is constructed with devices having different voltage characteristics, e.g., threshold voltage, than the voltage characteristics of devices comprising conventional inverter circuit 110, the effects of voltage compensating feedback circuit 120 upon conventional inverter circuit 110 will vary with frequency. More specifically, voltage compensating feedback circuit 120 will oppose the operation of conventional inverter circuit 110 to a greater or lesser extent at different supply voltages.

For a low range of supply voltages, e.g., supply voltages below about 500 mV, voltage compensating feedback circuit 120 will have substantially no effect upon the operation of conventional inverter circuit 110. More specifically, the operating characteristics of voltage compensated inverter circuit 100 will be substantially dominated by the operating characteristics of conventional inverter circuit 110.

For a middle range of voltages, e.g., supply voltages between about 600 mV and about 1.4 V, voltage compensating feedback circuit 120 will affect the operation of conventional inverter circuit 110 to a varying degree. Within such a middle range of voltages, voltage compensating feedback circuit 120 becomes "stronger," or has a higher current output, and operates faster with increasing voltage. More specifically, the operating characteristics of voltage compensated inverter circuit 100 will be increasingly influenced by voltage compensating feedback circuit 120, corresponding with increasing supply voltage in this range.

It is to be appreciated that, because voltage compensating feedback circuit 120 is coupled in opposition to conventional inverter circuit 110, as voltage compensating feedback circuit 120 becomes "stronger" and faster with increasing supply voltage, this behavior opposes characteristics of conventional inverter circuit 110 to become faster with increasing supply voltage. As a beneficial consequence, voltage compensated inverter circuit 100 exhibits less dependence of operating characteristics on supply voltage than conventional inverter circuit 110 alone.

The size, shape and threshold voltages of transistor devices 130 and 140 to achieve a desired feedback characteristic can be determined through a process of simulation. The size, configuration and characteristics of conventional inverter circuit 110 are typically provided to a designer as standard elements of a logic family for a specific semiconductor process. Size and shape of transistor devices in integrated circuits are generally given as a ratio, e.g., "5/8." The first number specifies the width of the cell, e.g., "5," and the second number specifies the length of the cell, e.g., "8." The numbers typically indicate the dimension in microns. For an exemplary voltage compensated inverter circuit 100 constructed in a 0.13 micron process, conventional inverter circuit 110 can comprise a 10/8 p-type device (not shown) and a 5/8 n-type device (not shown). Device 130 can be a 5/1.6 thick gate p-type device, and device 140 can be a 2.5/1.6 thick gate n-type device.

Because feedback circuit 120 comprises transistor devices, e.g., transistor devices 130 and 140, having significant differences in construction from transistor devices comprising conventional inverter circuit 110, e.g., substantial differences in area and gate thickness, characteristics of feedback circuit 120 vary differently with supply voltage than do characteristics of conventional inverter circuit 110. More specifically, a frequency-voltage characteristic of feedback circuit 120 will typically have a different shape than a frequency-voltage characteristic of conventional inverter circuit 110.

For circuits intended to operate at supply voltages up to and within a middle range of voltages, e.g., supply voltages from 0 volts up to about 1.4 V in the present example, such differences between the shape of frequency-voltage characteristics for the two stages may be discounted.

However, above a certain supply voltage, for example about 1.4 volts, differences between the shape of frequency-voltage characteristics for the two stages can become significant. For such supply voltages, the frequency-voltage characteristics of voltage compensating feedback circuit 120 can "overpower" conventional inverter circuit 110, producing a slight decrease in maximum operating frequency with increasing supply voltage for the combined voltage compensated inverter circuit 100.

Figure 2:
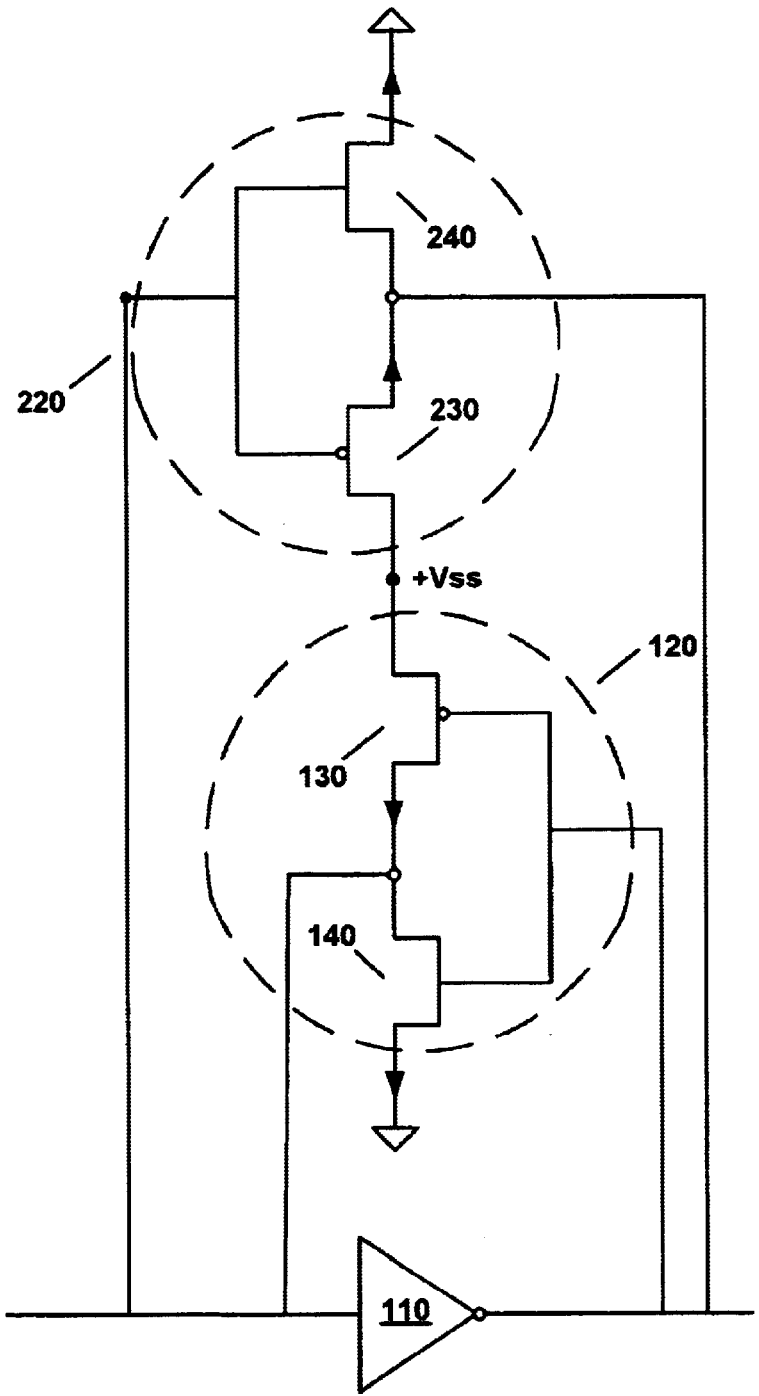
FIG. 2 illustrates a voltage compensated inverter circuit, in accordance with embodiments of the present invention.

In order to advantageously overcome such higher voltage characteristics of voltage compensated inverter circuit 100, an additional stage of feedback can be added. FIG. 2 illustrates a voltage compensated inverter circuit 200, in accordance with embodiments of the present invention. In addition to the elements of voltage compensated inverter circuit 100 (FIG. 1), voltage compensated inverter circuit 200 comprises an additional, or second feedback circuit 220. Second feedback circuit 220 comprises a p-type transistor device 230 and an n-type transistor device 240.

It is to be appreciated that second feedback circuit 220 forms an inverter circuit. It is to be further appreciated that second feedback circuit 220 is coupled to voltage compensating feedback circuit 120 so as to provide feedback to voltage compensating feedback circuit 120. More specifically, the output of voltage compensating feedback circuit 120 drives the input of second feedback circuit 220 and the output of second feedback circuit 220 drives the input of voltage compensating feedback circuit 120.

Additionally, it is to be appreciated that second feedback circuit 220 actually reinforces conventional inverter circuit 110.

Transistor elements 230 and 240 are constructed so as to have a higher threshold voltage than the transistor elements comprising voltage compensating feedback circuit 120 (which comprises transistor elements with higher threshold voltages than the transistor elements comprising conventional inverter circuit 110). In accordance with embodiments of the present invention, such a higher threshold voltage may be achieved by constructing transistor elements 230 and 240 to comprise "thicker" gates than those of voltage compensating feedback circuit 120. Embodiments in accordance with the present invention are well suited to other techniques of adjusting threshold voltages of transistor devices, e.g., varying gate length and/or changing doping concentrations.

Second feedback circuit 220 serves to oppose the capability of voltage compensating feedback circuit 120 to overpower conventional inverter circuit 110 at higher supply voltages. As a beneficial consequence, voltage compensated inverter circuit 200 has more consistent operating characteristics, e.g., maximum frequency, switching and delay times, over a wider range of supply voltages in comparison with voltage compensated inverter circuit 100.

It is to be appreciated that additional feedback stages beyond the two shown in FIG. 2 can be added to improve the "flatness" of frequency response with respect to supply voltage of a voltage compensated circuit. Further, additional feedback stages can increase a range of supply voltages over which a desired flat frequency response to that supply voltage can be achieved. Embodiments in accordance with the present invention are well suited to a plurality of feedback stages.

A ring oscillator circuit generally comprises an odd number of inverter stages coupled in a ring configuration. It is to be appreciated that other inverting circuits, e.g., a NAND gate, are well suited to embodiments in accordance with embodiments of the present invention. A ring oscillator will oscillate, or "ring," at a frequency determined, in part, by switching delay times of the inverter stages and the number of inverter stages. Ring oscillators are a straight-forward source of oscillating clock signals in integrated circuits, and are an ideal frequency source for many applications. Since a ring oscillator does not require external components, e.g., a crystal, ceramic resonator or external resistors and/or external capacitors, ring oscillators can be implemented at lower cost and in a smaller size than many other clock sources.

However, ring oscillators are sometimes not used in integrated circuit designs because their frequency of operation is determined (in part) by the switching delay time of each inverter stage. As has been discussed previously, switching delay time of a conventional inverter stage varies with supply voltage. Consequently, the frequency of a conventional ring oscillator varies with supply voltage. Because a conventional ring oscillator frequently has many stages, the variation of switching delay time due to supply voltage changes for a single stage is magnified by the number of stages, producing great frequency variations in response to supply voltage changes for the entire oscillator.

Figure 3:
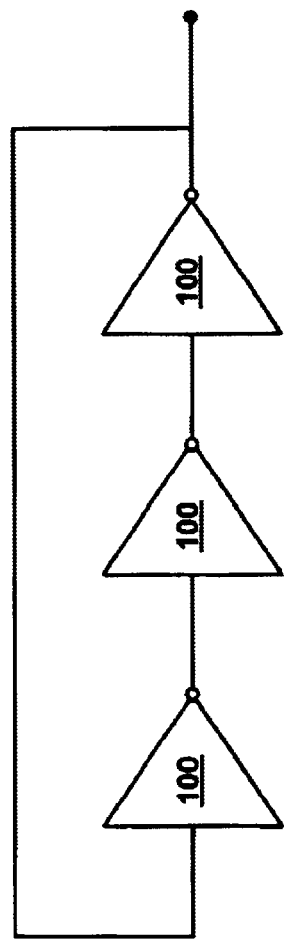
FIG. 3 illustrates a voltage compensated ring oscillator circuit, in accordance with embodiments of the present invention.

FIG. 3 illustrates a voltage compensated ring oscillator circuit 300, in accordance with embodiments of the present invention. Voltage compensated ring oscillator circuit 300 comprises three stages. Each stage is comprised of a voltage compensated inverter circuit 100 as described above. Ring oscillators constructed with other voltage compensated circuits, e.g., voltage compensated inverter circuit 200 or circuits comprising more stages of feedback, are well suited to embodiments in accordance with the present invention. The frequency of operating of a ring oscillator, e.g., voltage compensated ring oscillator circuit 300, depends on the delay inherent to each inverter stage and the number of stages provided in the ring.

Because the stages comprising voltage compensated ring oscillator circuit 300 have a stable frequency response over a range of supply voltages, voltage compensated ring oscillator circuit 300 exhibits a similar desirable stable frequency response over a range of supply voltages. Voltage compensated ring oscillator circuit 300 can be advantageously utilized to provide a stable frequency, e.g., for use as a microprocessor clock or to control a charge pump circuit, during a power supply ramp up and/or ramp down period. Further, voltage compensated ring oscillator circuit 300 can beneficially provide a stable frequency while a supply voltage of an integrated circuit, e.g., a microprocessor, is changed in order to optimize a relationship between performance requirements and power consumption of the integrated circuit.

Figure 4:
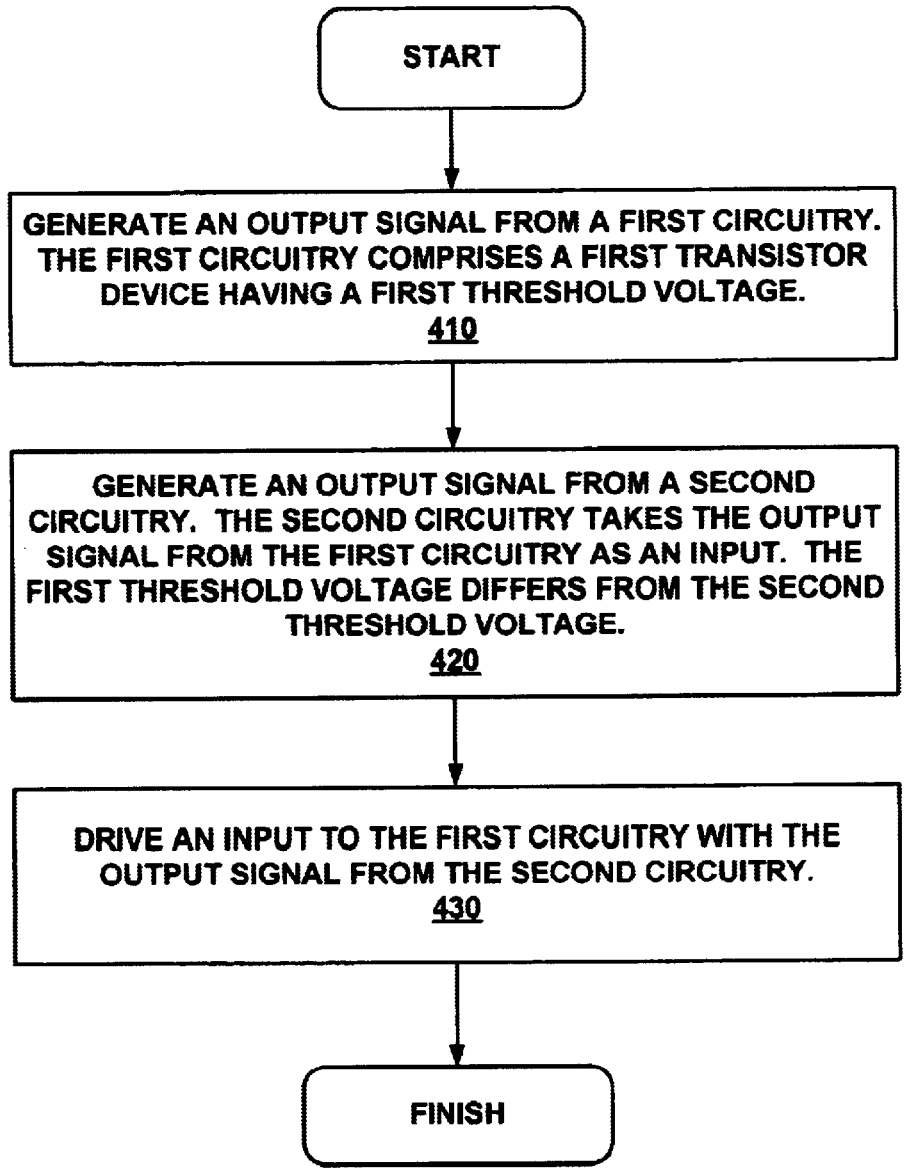
FIG. 4 illustrates a flow diagram of a method of operating an integrated circuit, in accordance with embodiments of the present invention.

FIG. 4 illustrates a flow diagram of a method 400 of operating an integrated circuit, in accordance with embodiments of the present invention. In block 410, an output signal from a first circuitry is generated. The first circuitry comprises a first transistor device having a first threshold voltage.

In block 420, an output signal from a second circuitry is generated. The second circuitry comprises a second transistor device having a second threshold voltage. The second circuitry takes the output signal from the first circuitry as an input. The first threshold voltage differs from the second threshold voltage.

In block 430, an input to the first circuitry is driven with the output signal from the second circuitry. In this novel manner, the second circuit provides a feedback signal to the first circuitry, enhancing the stability of characteristics, e.g., maximum frequency, switching and delay times, with respect to supply voltage of the combination of the two circuits in comparison to the characteristics of the first circuitry alone.

Embodiments in accordance with the present invention, voltage compensated integrated circuits, are thus described. While the present invention has been described in particular embodiments, it should be appreciated that the present invention should not be construed as limited by such embodiments, but rather construed according to the below claims.

What is claimed is:

1. An integrated circuit comprising:
    a first stage comprising first transistor devices comprising a first threshold voltage;
    a first feedback stage comprising transistor devices comprising a first plurality of threshold voltages, wherein at least one of said first plurality of threshold voltages is different from said first threshold voltage, wherein said first feedback stage is coupled to said first stage in a feedback configuration;
    wherein said first feedback stage comprises a frequency-voltage characteristic that, when combined in opposition with a frequency-voltage characteristic of said first stage, produces a frequency-voltage characteristic of said integrated circuit that is more stable with respect to voltage over a range of frequencies than is said first stage;

wherein said feedback configuration comprises an output of said first stage driving an input of said first feedback stage and output of said first feedback stage driving an input of said first stage; and wherein said first feedback stage comprises a second feedback stage, said second feedback stage comprising:

transistor devices comprising a second plurality of threshold voltages, wherein at least one of said second plurality of threshold voltages is different from one of said first plurality of threshold voltages; and wherein said second feedback stage is coupled to said first feedback stage in a feedback configuration.

2. The integrated circuit of claim 1 wherein said first stage, said first feedback stage and said second feedback stage comprise an inverter stage.

3. The integrated circuit of claim 1 comprising at least three transistor devices, each transistor having different gate thicknesses.

4. The integrated circuit of claim 1 embodied within a microprocessor.

5. The integrated circuit of claim 4 embodied within a computer system.

* * * * *